United States Patent [19]
Usui et al.

[11] Patent Number: 4,882,612
[45] Date of Patent: Nov. 21, 1989

[54] POWER SEMICONDUCTOR DEVICE

[75] Inventors: Yasunori Usui, Yokohama; Hiroshi Okamura, Kawasaki; Yoshinari Uetake, Sagamihara; Takashi Fujiwara, Yokohama, all of Japan

[73] Assignee: Kabushiki Kaisha Toshiba, Kawasaki, Japan

[21] Appl. No.: 45,468

[22] Filed: May 4, 1987

[30] Foreign Application Priority Data

May 17, 1986 [JP] Japan .................................. 61-111808

[51] Int. Cl.4 ............................................. H01L 23/42
[52] U.S. Cl. .................................................. 357/79
[58] Field of Search ........................................ 357/79

[56] References Cited
U.S. PATENT DOCUMENTS

| | | | |
|---|---|---|---|
| 3,559,004 | 1/1971 | Rambeau et al. | 357/79 |
| 3,585,454 | 6/1971 | Roberts | 357/79 |
| 3,721,867 | 3/1973 | Schierz | 357/79 |
| 3,837,000 | 9/1974 | Platzoeder et al. | 357/79 |
| 4,104,676 | 8/1978 | Bednorz et al. | 357/79 |
| 4,305,087 | 12/1981 | Wislocky | 357/79 |
| 4,389,662 | 6/1983 | Miyajima | 357/79 |

FOREIGN PATENT DOCUMENTS 0158749 12/1984 European Pat. Off. .
87107084 7/1988 Netherlands .

Primary Examiner—Rolf Hille
Assistant Examiner—Steven H. Y. Loke
Attorney, Agent, or Firm—Finnegan, Henderson, Farabow, Garrett and Dunner

[57] ABSTRACT

In a power semiconductor device according to the present invention, a sheet, formed of a soft metal such as Ag, is provided on that portion of a pressing control electrode which is brought into contact with an Al gate electrode of a pellet. By means of this sheet, it is possible both to apply a strong pressing power to the Al gate electrode and to reduce the contact resistance between the two electrode. Since an excessive amount of heat is not produced on account of the contact resistance, the semiconductor device can be protected against being damaged.

6 Claims, 3 Drawing Sheets

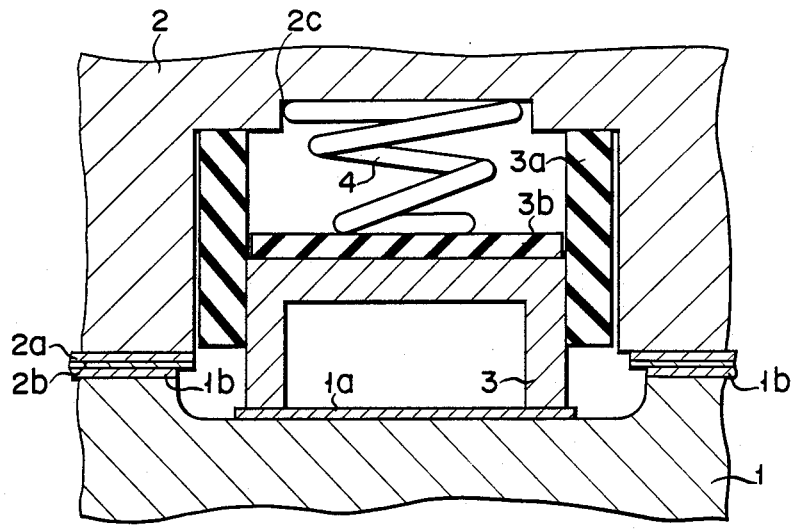
FIG. 1 (PRIOR ART)
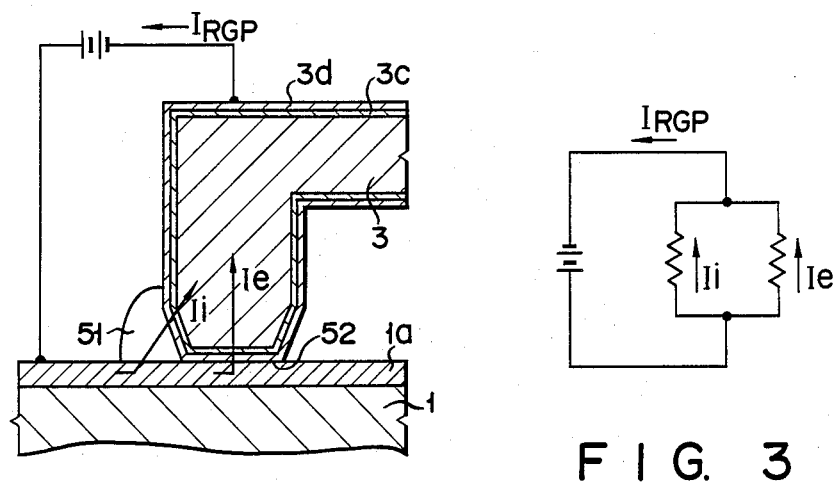
FIG. 2
FIG. 3

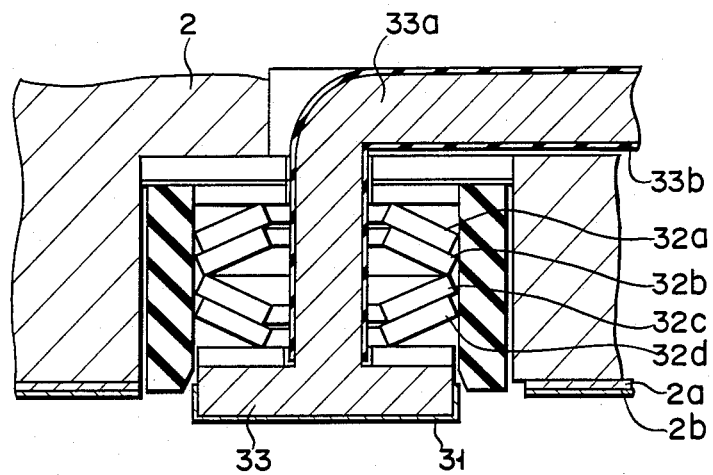
F I G. 6
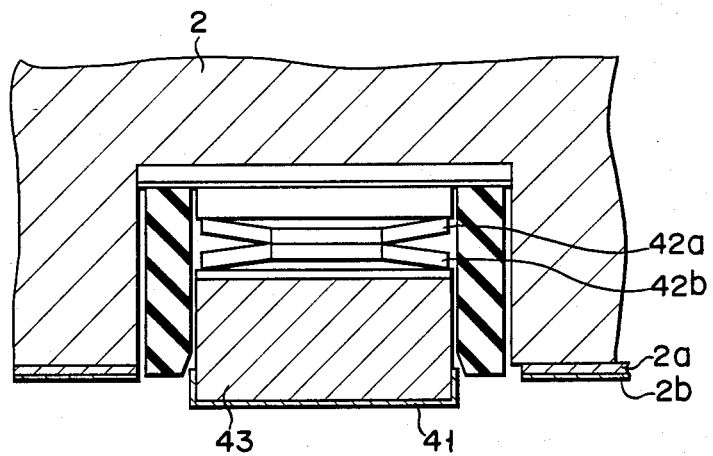
F I G. 7

POWER SEMICONDUCTOR DEVICE

BACKGROUND OF THE INVENTION

The present invention relates to a power semiconductor device in which the control electrode section has a solderless contact construction and, more particularly, to an improvement of the solderless contact construction.

In recent years, remarkable progress has been made in increasing the power capacity of a power semiconductor device. In the case of a gate turn-off thyristor (hereinafter referred to as a GTO thyristor), the maximum turn-off current $I_{TGQ}$ was 800A in the early 1980s. Thereafter, the maximum turn-off current $I_{TGQ}$ was increased every year, and by the middle of 1980s, a GTO thyristor, the maximum turn-off current of which was increased up to 2,700A, because commercially available. With this increase in maximum turn-off current $I_{TGQ}$, the maximum value $I_{RGP}$ of the reverse gate current for turning off a GTO thyristor was also increased every year; it increased from 200A to as large as 700A.

With an incrase in the power capacity of power semiconductor devices such as a power transistor, an ordinary thyristor, a GTO thyristor etc., a solderless contact construction has come to be widely employed for connecting the element-controlling electrode (e.g., the gate electrode of the thyristor, and the base electrode of the transistor) and the external lead to each other. Solderless contact construction is usually adopted in the fabrication of a power semiconductor device with increased power capacity, such as a GTO thyristor the turn-off current of which exceeds 1000A.

FIG. 1 is a sectional view illustrating the solderless contact construction of the gate electrode section of a conventional GTO thyristor.

In FIG. 1, reference numeral 1 represents a semiconductor pellet on which a GTO element is formed. Gate electrode 1a formed of Al (aluminium) is located in the center of pellet 1, and cathode element 1b surrounds gate electrode 1a. Reference numeral 2 represents a pressing cathode formed of Cu (copper). Pressing cathode 2 urges cathode element 1b, with buffer plate 2a and foil 2b, both formed of Mo (molybdenum), interposed therebetween. Reference numeral 3 represents a pressing gate which is insulated from pressing cathode 2 by Telfon ring 3a and ceramic disk 3b. Generally, pressing gate 3 is formed of a base material of Cu plated with Ni (nickel) and Ag (silver). The Ag layer generally has a thickness of several μm.

As is shown in FIG. 1, pressing gate 3 is urged by coil spring 4 placed on spring seat 2c of pressing cathode 2, to urge gate electrode 1a of the GTO thyristor via pressing gate 3.

In a GTO thyristor which uses the solderless contact structure shown in FIG. 1 and the maximum turn-off current of which is 2,000A, the pressing gate with a pressing area of 52 mm² is urged, by the coil spring with a pressure of 1.5 kg, to urge the gate electrode, formed on the pellet. Accordingly, the pressure per unit area is about 0.03 kg/mm².

It has recently been found, however, that the conventional solderless contact construction is inappropriate to a GTO thyristor with an increased power capacity. If the GTO thyristor, the maximum value $I_{RGP}$ of the reverse gate current of which exceeds 300A, is used continuously over a long period of time, the contact resistance between the gate and the cathode increases with time. Within about 3-5 years, the gatecathode resistance increases considerably. In the end, the Al layer, which constitutes gate electrode 1a on the pellet, is melted by the heat generated due to the increased resistance of the pressed sections. As a result, the breakdown voltage between the anode and the cathode of the GTO thyristor is adversely affected. This pnenomenon can be observed with respect to not only the GTO thyristor but a power transistor with a pressed base.

SUMMARY OF THE INVENTION

The object of the present invention is to provide a power semiconductor device with a large power capacity, which includes a control electrode section with a solderless contact construction, and in which a semiconductor element can be reliably prevented from being damaged in the cause of the increase of the contact resistance at the solderless contact after long, continuous use of the power semiconductor device.

The inventors of the present invention have studied the cause of the increase in the contact resistance of the conventional power semiconductor device, and, as a result, has come up with the following findings:

When Ni plating 3c and Ag plating 3d (both are shown in FIG. 2) are formed on the surface of pressing control electrode 3, the surface of the resultant plating is inevitably rough. This may be the first cause of the increase in contact resistance. Second, the Al particles of Al gate electrode 1a are coarse. Third, the pressure per unit area applied between pressing control electrode 3 and Al gate electrode 1a is comparatively small; it is about 0.02 kg/mm², with the result that the contact between control electrode 3 and Al gate electrode 1 is insufficient at contact portion 52 (FIG. 2).

For these reasons, the potential difference at contact portion 52 will be greater than 0.10V if reverse gate current $I_{RGP}$ exceeds 300A. If this occurs, Al atoms will begin to flow from Al gate electrode 1a on the pellet, toward control electrode 3 via electrolyte 51 which is attached, in the vicinity of contact portion 52, to both control electrode 3 and gate electrode 1a. As a result, the resistance between the gate and the cathode will increase considerably after the power semiconductor device has been used continuously for 3-5 years.

According to the present invention, there is provided a control electrode, an electrode provided for a semiconductor element, a foil member formed of a soft metal and interposed between the electrodes, and a member for pressing the electrodes against each other.

The characteristic feature of the power semiconductor device of the present invention is that the pressing control electrode is urged to press the Al electrode on the pellet, with a soft metal sheet interposed between the two electrodes. Desirably, the device of the present invention is designed in such a manner that the pressure per unit area is greater than 0.14 kg/mm². It is also desirable that the soft metal sheet be formed of a foil of a conductive metal, such as Ag, Au, or Pt (platinum), having a thickness ranging from about 30 to 150 μm.

In the device of the present invention, the pressing control electrode urges the Al electrode on the pellet, with the soft metal sheet interposed therebetween. Thus, the pressing control electrode and the Al electrode on the pellet can be brought into tight contact with each other. As a result, the contact resistance between the two electrodes will be 0.05 m if the pressure is greater than 0.14 kg/mm². The contact resistance of the semiconductor device according to the present invention is, therefore, less than one tenth of the corresponding contact resistance of the conventional device. Even if maximum value $I_{RGP}$ of the reverse gate current is 700A, the potential drop, which may occur at the contact portion of the gate, due to the flow of electric current $I_e$, is not more than 0.028V. Since the flow of Al through electrolyte 51 is not markedly accelerated until the potential drop at the contact portion becomes more than 0.1V, ion current $I_i$ (FIGS. 2 and 3) does not flow as long as the potential drop is so small as in the present invention. Therefore, it can be expected that the lift of the device of the present invention will be around 300 times as long as that of the conventional device.

BRIEF DESCRIPTION OF THE DRAWINGS

FIG. 1 is a cross sectional view illustrating the solderless contact construction of the gate of a conventional GTO thyristor;

FIG. 2 is an enlarged view illustrating part of the solderless contact construction;

FIG. 3 shows an equivalent circuit of the solderless contact construction shown in FIG. 2;

FIG. 6 is a cross-sectional view illustrating the solderless contact construction of the gate of a GTO thyristor according to a second embodiment of the present invention; and FIG. 7 is a cross-sectional view illustrating the solderless contact construction of the gate of a GTO thyristor according to a third embodiment of the present invention.

PREFERRED EMBODIMENTS OF THE INVENTION

Figure 4:
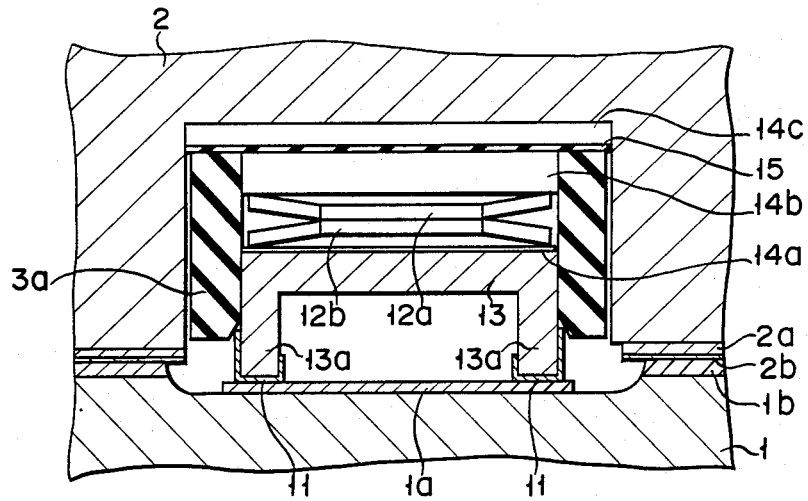
FIG. 4 is a cross-sectional view illustrating the solderless contact construction of the gate of a GTO thyristor according to a first embodiment of the present invention.

FIG. 4 is a cross-sectional view of the solderless contact construction of the gate of a GTO thyristor according to an embodiment of the present invention. In FIG. 4, the same reference numerals as those in FIG. 1 are used to represent the corresponding parts of the prior art.

Reference numeral 1 designates a semiconductor pellet on which a GTO element is formed. Gate electrode 1a, which is formed of Al (aluminium), is located in the center of pellet 1, and cathode element 1b is arranged around gate electrode 1a. Reference numeral 2 designates a pressing cathode formed of Cu (copper). Pressing cathode 2 urges cathode element 1b, with buffer plate 2a and foil 2b, both formed of Mo (molybdnum), interposed therebetween. Reference numeral 13 designates a pressing gate formed of Cu located on the pressing side of the GTO thyristor. The central portion of pressing gate 13 is hollowed to form annular peripheral contact portion 13a. The hollow construction of gate 13 will be effective in ensuring a uniform pressure against pellet 1. Contact portion 13a has a contact area of about 50 mm² which is in contact with Al gate electrode 1a on pellet 1. Although not illustrated in the drawings, pressing gate 13 is formed of a base material of Cu plated with Ni and Ag. Cap member 11, formed of an Ag sheet with a thickness of 100 μm and subjected to an annealing process, is fitted around contact portion 13a in such a manner that contact portion 13a is completely covered. Pressing gate 13 urges Al gate electrode 1a on pellet 1 by means of initially coned disk springs 12a and 12b which can produce a combined pressing power ranging from 40 kgw to 100 kgw (0.8 kgw/mm² to 2 kgw/mm²). Washer 14a is located between spring 12b and pressing gate 13, and washers 14b and 14c, which are stacked on each other, are located between spring 12a and pressing cathode 2. Insulating sheet 15, formed of a mica which can withstand a high pressure, is interposed between washers 14b and 14c. Together with Teflon ring 3a, insulating sheet 15 provides insulation between pressing gate 13 and pressing cathode 2.

Figure 5:
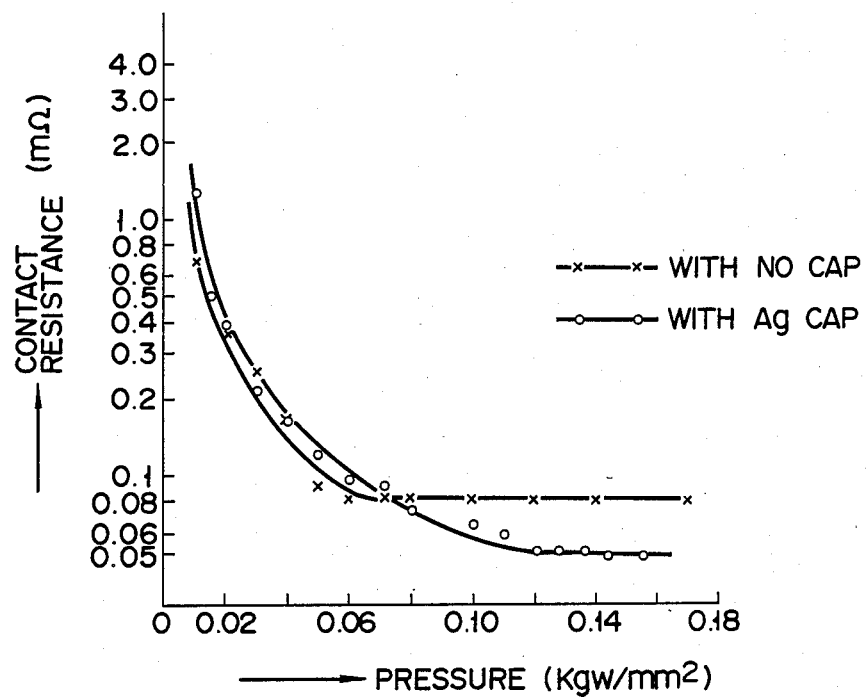
FIG. 5 is a graph showing the relationship between the pressure per unit area and the contact resistance with respect to a GTO thyristor having the solderless contact construction shown in FIG. 4.

FIG. 5 shows the characteristics of the GTO thyristor of the first embodiment (FIG. 4) of the present invention. In FIG. 5, the pressure which the pressing gate applied per unit area is plotted along the ordinate, and the contact resistance of the gate is plotted along the abscissa. For the sake of comparison, the characteristics of the case where an Ag cap is not used in the device of the first embodiment (i.e., the construction similar to that of the prior art) are also shown in FIG. 5, by way of the curve indicated as "WITH NO CAP").

As can be seen from FIG. 5, the presence or absence of the cap has virtually no influence as regards the contact resistance if the pressing power is less than 0.06 kgw/mm². However, if the pressing power is increased to more than 0.06 kgw/mm², the contact resistance remains substantially constant (about 0.08 mΩ) in the case where the cap is not used, while it continues to decrease further in the case where the cap is provided, as in the first embodiment (FIG. 4) of the present invention. In the latter case, the contact resistance does not become constant (0.05 mΩ) until the pressing power is increased up to 0.12 kgw/mm².

As long as the contact resistance is 0.05 mΩ, potential difference Vd can be represented by the equation below, even if $I_{RGP}$ is 700A.

$$Vd = 700A \times 0.05 \text{ m}\Omega = 0.035V.$$

This potential difference is sufficiently lower than 0.1V, at which level Al atoms begin to flow from Al gate electrode 1a on pellet 1.

The inventors of the present invention compared the GTO thyristor of the first embodiment (FIG. 4) of the present invention (pressing power: 1.3 kgw/mm²) with the conventional GTO thyristor (pressing power: 0.02 kgw/mm²) by continuously driving the two thyristors under the same operating condition. The operating condition was such that the maximum value $I_{RGP}$ of the reverse gate current, used for turning off the GTO thyristors, was determined to be greater than the rated value. In the case of the conventional GTO thyristor, the surface of the Al electrode on the pellet became rought within 3-5 hours, due to the flow of Al atoms. In the case of the GTO thyristor of the first embodiment (FIG. 4) of the present invention, in contrast, the surface of the Al electrode remained unchanged even after continuously driving the thyristor for 1,000 hours. Therefore, the GTO thyristor according to the first embodiment of the present invention is expected to have a life at least 300 times longer than that of the conventional GTO thyristor.

In the present invention, the shape of the control electrode is not limited to the one shown in FIG. 4.

FIG. 6 is a cross-sectional view illustrating the solderless contact of the gate of a GTO thyristor according to a second embodiment of the present invention. As illustrated, pressing gate 33 is not hollowed and is pressed against the Al electrode on the pellet. Pickup section 33a extends upward from the center of the upper side of the pressing gate, and is bent in the horizontal direction at the location where it enters the interior of pressing cathode 2. Insulating member 33b is formed on the surface of pickup section 33a. Cap 31, formed of Ag and having a thickness of about 150 μm, is fitted around pressing gate 33 such that the entire contact area is covered. Washers 32a, 32b, 32c, and 32d are provided such that they are brought into contact with pressing gate 33, with a pressing power of more than 0.14 kgw/mm$^2$ per unit area. In FIG. 6, the pellet is not shown, for the sake of simplicity.

FIG. 7 is a cross-sectional view of the solderless contact of the gate of a GTO thyristor according to a third embodiment of the present invention. In this embodiment, a pressing gate in the form of a small block is used. Cap 41, formed of Ag and having a thickness of about 50 μm, is fitted around the pressing surface of pressing gate 43. Two initially coned disk springs, 42a and 42b, are brought into contact with pressing gate 43, with a pressing power of 0.14 kgw/mm$^2$ per unit area. In FIG. 7 as well, the pellet is not shown, for the sake of simplicity.

As in the first embodiment (FIG. 4), the GTO thyristors according to the second and third embodiments (FIGS. 6 and 7) can be expected to have a longer life than that of conventional GTO thyristors.

Not only Ag but other soft metals, such as Au and Pt, can be used for forming caps 11, 31, and 41, and it is preferable that the sheets of these caps be in the range of about 30 to 150 μm.

In the power semiconductor device of the present invention, the control electrode can be brought into tight contact with the electrode of the semiconductor element, with soft metal foil interposed between the two electrodes. Since the contact resistance between the two electrodes is reduced, the contact potential difference can be decreased to less than 0.1V, even if a large amount of current flows through the control electrode. As a result, hardly any metal flows from the electrode of the element, and thus the contact resistance does not increase, even after the device has been driven for a long period of time. Therefore, the life of the power semiconductor can be increased considerably.

What is claimed is:

1. A power semiconductor device with a solderless contact construction, comprising:
   a control electrode;
   an electrode provided for a semiconductor element;
   a foil member formed of a soft metal and interposed between said electrodes; and
   a member for pressing said electrodes against each other and for supplying a pressing power of more than 0.14 kgw/mm$^2$ per unit area.

2. A power semiconductor device according to claim 1, wherein the control electrode is a pressing gate electrode located on a pressing side of a gate-turnoff thyristor, and the electrode provided for the semiconductor element is a gate electrode of the gate-turnoff thyristor.

3. A power semiconductor device according to claim 1, wherein the control electrode is a pressing base electrode of a power transistor, and the electrode provided for the semiconductor element is a base electrode of the power transistor.

4. A power semiconductor device according to claim 1, wherein the soft metal, with which to form the foil member, is selected from the group including Ag, Au, and Pt.

5. A power semiconductor device according to claim 1, wherein the foil member has a thickness ranging from about 30 to 150 μm.

6. A power semiconductor device according to claim 1, wherein the foil member is constructed such that it can be fitted around the control electrode.

* * * * *